United States Patent
Abe

(10) Patent No.: US 10,004,158 B2
(45) Date of Patent: Jun. 19, 2018

(54) ELECTRONIC APPARATUS HAVING A PLURALITY OF COOLING FANS FOR SUPPRESSING TEMPERATURE INCREASE WITHIN THE ELECTRONIC APPARATUS

(71) Applicant: CANON KABUSHIKI KAISHA, Tokyo (JP)

(72) Inventor: Naoyuki Abe, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/064,263

(22) Filed: Mar. 8, 2016

(65) Prior Publication Data

US 2016/0270256 A1    Sep. 15, 2016

(30) Foreign Application Priority Data

Mar. 9, 2015    (JP) ................. 2015-045945

(51) Int. Cl.
*G03B 21/16* (2006.01)
*H05K 7/20* (2006.01)

(52) U.S. Cl.
CPC ......... *H05K 7/20209* (2013.01); *G03B 21/16* (2013.01); *H05K 7/20145* (2013.01)

(58) Field of Classification Search
CPC .......... H05K 7/20; G03B 17/55; G03B 21/16; H04N 5/22
See application file for complete search history.

(56) References Cited

U.S. PATENT DOCUMENTS

| | | | |
|---|---|---|---|
| 2011/0019160 A1* | 1/2011 | Kitano | G03B 21/16 353/57 |
| 2014/0055623 A1* | 2/2014 | Okada | H04N 5/232 348/177 |
| 2014/0094973 A1* | 4/2014 | Giaimo, III | G01H 3/10 700/280 |

FOREIGN PATENT DOCUMENTS

| | | |
|---|---|---|
| JP | 2014-042168 A | 3/2014 |
| JP | 2014-045345 A | 3/2014 |

* cited by examiner

*Primary Examiner* — Sultan Chowdhury
*Assistant Examiner* — Danell L Owens
(74) *Attorney, Agent, or Firm* — Cowan, Liebowitz & Latman, P.C.

(57) ABSTRACT

An electronic apparatus which is capable of suppressing temperature increase in an interior of the electronic apparatus and also reducing effects of noise arising from operation of a fan during sound recording even when sound is recorded over a long time period. A duct unit joins an inlet and an outlet, which are formed in a cabinet of the electronic apparatus, to each other and is thermally connected to a heat source. A first fan blows air in the duct unit from the inlet toward the outlet. A second fan circulates air inside the electronic apparatus. According to a sound recording operation, the first fan and the second fan are drivingly controlled in a selective manner.

15 Claims, 6 Drawing Sheets

*FIG. 8*

| COMPARISON RESULTS | FIRST FAN CONTROL | SECOND FAN CONTROL |
|---|---|---|
| $Tp \leq Xp, Tc \leq Xc, Tb \leq Xb$: | STOP | HIGH REVOLUTION |
| $Tp > Xp, Tc \leq Xc, Tb \leq Xb$ | LOW REVOLUTION | HIGH REVOLUTION |
| $Tp > Xp, Tc > Xc, Tb \leq Xb$ | HIGH REVOLUTION | LOW REVOLUTION |
| $Tp > Xp, Tc \leq Xc, Tb > Xb$ | HIGH REVOLUTION | LOW REVOLUTION |
| $Tp > Xp, Tc > Xc, Tb > Xb$ | HIGH REVOLUTION | STOP |
| $Tp \leq Xp, Tc > Xc, Tb \leq Xb$ | LOW REVOLUTION | LOW REVOLUTION |
| $Tp \leq Xp, Tc > Xc, Tb > Xb$ | LOW REVOLUTION | STOP |
| $Tp \leq Xp, Tc \leq Xc, Tb > Xb$ | LOW REVOLUTION | LOW REVOLUTION |

ELECTRONIC APPARATUS HAVING A PLURALITY OF COOLING FANS FOR SUPPRESSING TEMPERATURE INCREASE WITHIN THE ELECTRONIC APPARATUS

BACKGROUND OF THE INVENTION

Field of the Invention

The present invention relates to an electronic apparatus, and in particular to an electronic apparatus such as an image pickup apparatus having a cooling fan.

Description of the Related Art

In recent years, along with miniaturization and increase in power consumption of image pickup apparatuses such as digital cameras which are exemplary electronic apparatuses, it is known that the interior of an image pickup apparatus is cooled using a cooling fan (hereafter referred to merely as a "fan"). To efficiently cool the interior of the image pickup apparatus, a duct is placed inside the image pickup apparatus. Various types of substrates which are heat sources are thermally connected to the duct, and by cooling the duct with air blown by the fan, the interior of the image pickup apparatus is efficiently cooled (see Japanese Laid-Open Patent Publication (Kokai) No. 2014-45345).

In an image pickup apparatuses, sound may be recorded during picture recording. If a fan is driven while sound is recorded, operating sound of the fan is recorded as well. To address this problem, it is known that during picture recording, a fan is stopped, or the RPM of the fan is held low. For example, there is known an image pickup apparatus which has a stop mode in which a fan is stopped during picture recording (see Japanese Laid-Open Patent Publication (Kokai) No. 2014-42168).

In the image pickup apparatus described in Japanese Laid-Open Patent Publication (Kokai) No. 2014-45345, as much heat as possible is required to be collected in a duct so as to efficiently cool the image pickup apparatus using the duct. Accordingly, the duct and heat sources such as substrates are required to be concentrated around the duct and thermally connected together.

With such an arrangement in which heat sources are concentrated around a duct, when a fan is stopped during picture recording, temperatures of electric elements on substrates rise within a short time period due to a plurality of heat sources placed in a concentrated manner. Thus, there is a limit to the time period for which the fan is stopped.

However, picture recording over a long time period leads to an extended time period over which the fan is at rest, causing temperatures of substrates to inevitably rise, and this may cause a malfunction.

SUMMARY OF THE INVENTION

The present invention provides an electronic apparatus, which is capable of suppressing temperature increase in the electronic apparatus and also reducing effects of noise arising from operation of a fan during sound recording even when picture is recorded over a long time period, as well as a storage medium.

Accordingly, the present invention provides an electronic apparatus that has a heat source and a sound recording function, comprising a duct unit configured to join an inlet and an outlet, which are formed in a cabinet of the electronic apparatus, to each other and be thermally connected to the heat source, a first air blowing unit configured to blow air in the duct unit from the inlet toward the outlet, a second air blowing unit configured to circulate air inside the electronic apparatus, and a control unit configured to, according to a sound recording operation, drivingly control the first air blowing unit and the second air blowing unit in a selective manner.

According to the present invention, even when picture is recorded over a long time period, temperature increase in the electronic apparatus is suppressed, and effects of noise arising from blowing of air during sound recording are reduced.

Further features of the present invention will become apparent from the following description of exemplary embodiments (with reference to the attached drawings).

BRIEF DESCRIPTION OF THE DRAWINGS

FIG. 8 is a view showing an exemplary control table for use in an RPM control step in FIG. 7.

DESCRIPTION OF THE EMBODIMENTS

Hereafter, exemplary electronic apparatuses according to embodiments of the present invention will be described with reference to the drawings.

Figure 1:
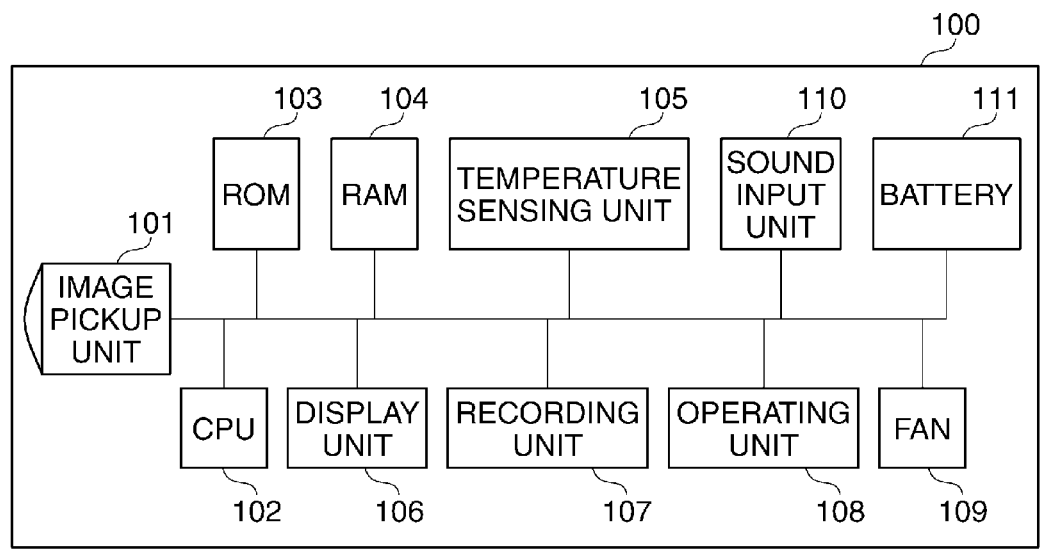
FIG. 1 is a block diagram showing an arrangement of an exemplary image pickup apparatus which is an electronic apparatus according to a first embodiment of the present invention.

FIG. 1 is a block diagram showing an arrangement of an exemplary image pickup apparatus which is an electronic apparatus according to a first embodiment of the present invention.

The image pickup apparatus in FIG. 1 is, for example, a digital camera (hereafter referred to simply as "the camera") 100 and has an image pickup unit 101. The image pickup unit 101 has an image pickup lens and an image pickup device, and the image pickup device has, for example, a CCD or a CMOS device and an A/D converter. An optical image is formed on the CCD or the CMOS device through the image pickup lens. The CCD or the CMOS device outputs an electric signal (analog signal) corresponding to the optical image, and the A/D converter converts the analog signal to a digital signal and outputs the analog signal as image data.

A sound input unit 110 has a microphone, which receives and converts external sound into an electric signal, and outputs sound data corresponding to the electric signal which is an output from the microphone. A ROM 103 is an electrically erasable and recordable memory and for example, an EEPROM. Constants, programs, and so forth for operation of a CPU 102 are stored in the ROM 103.

Those programs include programs for executing flowcharts, to be described later. The CPU 102 controls the overall image pickup apparatus 100. The CPU 102 carries out processes, to be described later, by executing programs recorded in the ROM 103.

A RAM 104 is used as a system memory, a work memory, an image memory, and a sound memory. Constants for operation of the CPU 102, variables, programs read from the ROM 103, and so forth are expanded on the RAM 104.

A temperature sensing unit 105 has first to three temperature sensing units as will be described later. The first temperature sensing unit detects a temperature of a substrate, on which the CPU 102, the ROM 103, and the RAM 104 are mounted, to output first temperature data. The second temperature sensing unit detects a temperature of the image pickup device to output second temperature data. The third temperature sensing unit detects a temperature of a battery 111 to output third temperature data. It should be noted that, for example, thermistors are used as the respective first to three temperature sensing units.

The image data described above is temporarily stored in, for example, the RAM 104. The CPU 102 displays on a display unit 106 an image corresponding to the image data recorded in the RAM 104. It should be noted that a liquid crystal panel, an organic EL, or the like is used for the display unit 106.

The sound data described above is temporarily stored in, for example, the RAM 104. The CPU 102 sends image data and sound data recorded in the RAM 104 to a recording unit 107, which in turn records the sent image data and sound data. It should be noted that the recording unit 107 is a recording medium such as a memory card. It should be noted that a semiconductor memory, a magnetic disk, a magnetic tape, or the like may be used as the recording medium.

An operating unit 108 is operated by a user and sends various types of instructions, which are received from the user, to the CPU 102. The camera 100 also has the battery 111 for power supply and a cooling fan 109.

Figure 2:
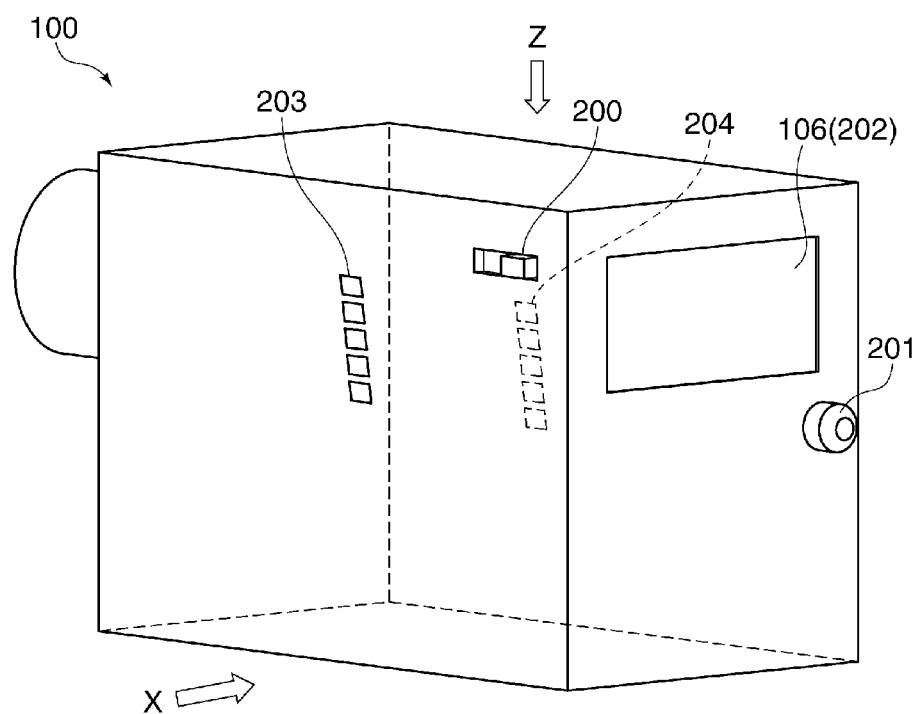
FIG. 2 is a perspective view showing an outer appearance of a camera in FIG. 1.
Figure 3:
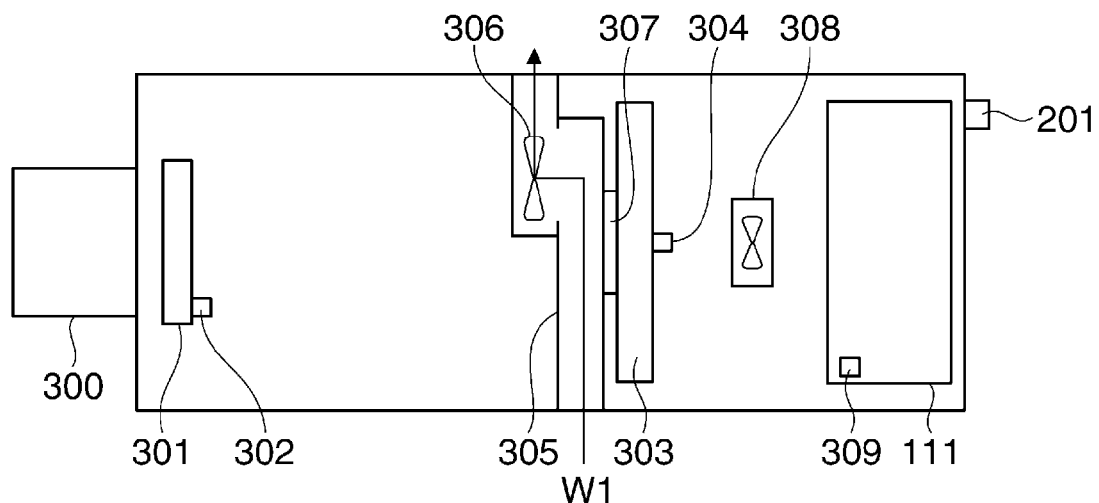
FIG. 3 is a diagram schematically showing an internal structure of the camera as viewed from a Z-direction in FIG. 2.
Figure 4:
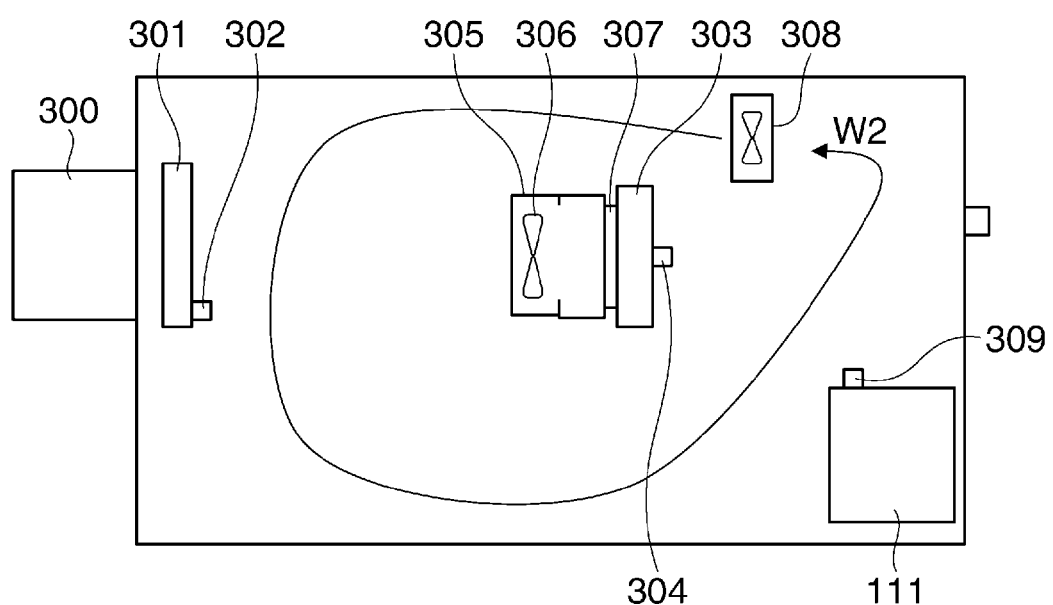
FIG. 4 is a diagram schematically showing an internal structure of the camera as viewed from an X-direction in FIG. 2.

FIG. 2 is a perspective view showing an outer appearance of the camera 100 in FIG. 1. FIG. 3 is a diagram schematically showing an internal structure of the camera 100 as viewed from a Z-direction in FIG. 2. FIG. 4 is a diagram schematically showing an internal structure of the camera 100 as viewed from an X-direction in FIG. 2. Referring now to FIGS. 2 to 4, a description will be given of a structure of the camera 100.

The image pickup unit 101 has the image pickup lens 300 and the image pickup device 301. The second temperature sensing unit 302 is disposed near the image pickup device 301. The CPU 102, the ROM 103, and the RAM 104 described above are mounted on the substrate 303, and the first temperature sensing unit 304 is disposed near the substrate 304. Further, the third temperature sensing unit 309 is disposed near the battery 111.

The operating unit 108 has, for example, a shutter button 201, a power button 200, and a touch panel 202. The shutter button 201 and the power button 200 are provided in a cabinet of the camera 100. The touch panel 202 is disposed on a display surface of the display unit 106.

The power button 200 is used to turn on or off the power to the camera 100. User's operation of the shutter button 201 causes the CPU 102 to store image data and sound data, which is obtained as a result of image pickup, in the recording unit 107. Various icons displayed on the display unit 106 are caused to act as various function buttons by the user selectively operating the icons using the touch panel 202. Examples of the functional buttons include an image pickup mode switching button, a zoom button, and a menu button.

When the user touches the zoom button, the CPU 102 starts a zooming operation to set an angle of view suitable for an image pickup scene. Thus, the user is allowed to intuitively configure various settings by touching the touch panel 202.

The fan 109 in FIG. 1 has a first fan 306 and a second fan 308. An inlet 203 and an outlet 204 are formed in the cabinet of the camera 100, and the inlet 203 and the outlet 204 are connected together by a duct unit (hereafter referred to merely as "the duct") 305 passing through an interior of the cabinet. Operation of the first fan 306 causes outside air to be taken in from the inlet 203, and the outside air thus taken in is discharged from the outlet 204 through the duct 305. Namely, the duct 305 is used as a ventilating passage. On the other hand, the second fan 308 is used to circulate air inside the camera 100.

The CPU 102 controls a motor (fan motor) which drives the fan 109 (that is, the first fan 306 and the second fan 308) to adjust the RPM of the fan 109. For example, the CPU 102 controls the fan motor by controlling input voltage values of the fan motor or controlling PWM.

It should be noted that the camera 100 is also equipped with a power supply unit for driving the camera 100, a terminal unit for inputting and outputting image data and sound data, and an electronic flash unit for illuminating a subject, and so on, but description thereof is omitted here.

Referring next to FIGS. 1 to 4, a description will be given of how to cool the camera 100 using the fan 109.

When the first fan 306 is driven, outside air is taken in from the inlet 203 to pass through the duct 305 as indicated by an arrow W1 in FIG. 3. This causes heat of the duct 305 to shift to the outside air, which has been taken in from the inlet 203, by forced convection. The air that has been heated to a high temperature due to the heat shifted to the air is discharged from the outlet 204 to exhaust heat from the camera 100.

The substrate 303 is thermally connected to the duct 305 via a thermally conductive member 307. With this arrangement, the temperature of the substrate 303 is lowered by shifting heat of the duct 305 to outside air. The higher the temperature of the duct 305 than the temperature of outside air, the greater the temperature difference between the duct 305 and the outside air, and the larger the amount of discharged heat. On the other hand, the closer the temperature of the duct 305 to the temperature of outside air, the smaller the temperature difference between the duct 305 and the outside air, and hence the smaller the amount of discharged heat. It should be noted that when the first fan 306 is driven, wind noise is generated in the inlet 203 and the outlet 204 to bring about an increase in operating sound (that is, fan noise).

When the second fan 308 is driven, air inside the camera 100 is circulated as indicated by an arrow W2 in FIG. 4. This diffuses heat of the substrate 303 into the camera main body 100. The diffused heat of the substrate 303 raise the temperature in the camera 100 and increases the amount of heat discharged from surfaces of the cabinet of the camera 100. This lowers the temperature of the substrate 303.

Thus, by driving the second fan 308, the speed at which temperatures of electric elements such as a CPU mounted on the substrate 303 is be kept low.

It should be noted that the second fan 308 merely circulates air inside the camera 100, and hence its operating noise is extremely low and hardly affects recording (sound recording). Specifically, since the second fan 308 is disposed inside the camera 100 and is not intended to send air from an inlet to an outlet, its fan noise is lower than that of the first fan 306. Moreover, since the second fan 308 merely circulates air inside the camera 100, a compact fan with low noise is allowed to be chosen as the second fan 308. However, when the second fan 308 is driven, heat inside the camera 100 is released from the surfaces of the cabinet through natural convection, and hence the amount of discharged heat is smaller than in the case where the fan 306 is driven.

When the first and second fans 306 and 308 are driven at the same time, the temperature of the substrate 303 is lowered, and the temperature of the duct 305 is lowered due to a cooling action of the second fan 308. For this reason, the amount of heat discharged by the first fan 306 is small. In some cases, the amount of heat discharged from the camera 100 as a whole is smaller in the case where the first and second fans 306 and 308 are driven at the same time than in the case where only the fan 306 is driven. Moreover, fan noise is the highest when the first and second fans 306 and 308 are driven at the same time. It is thus preferred that the first and second fans 306 and 308 are selectively driven.

Figure 5:
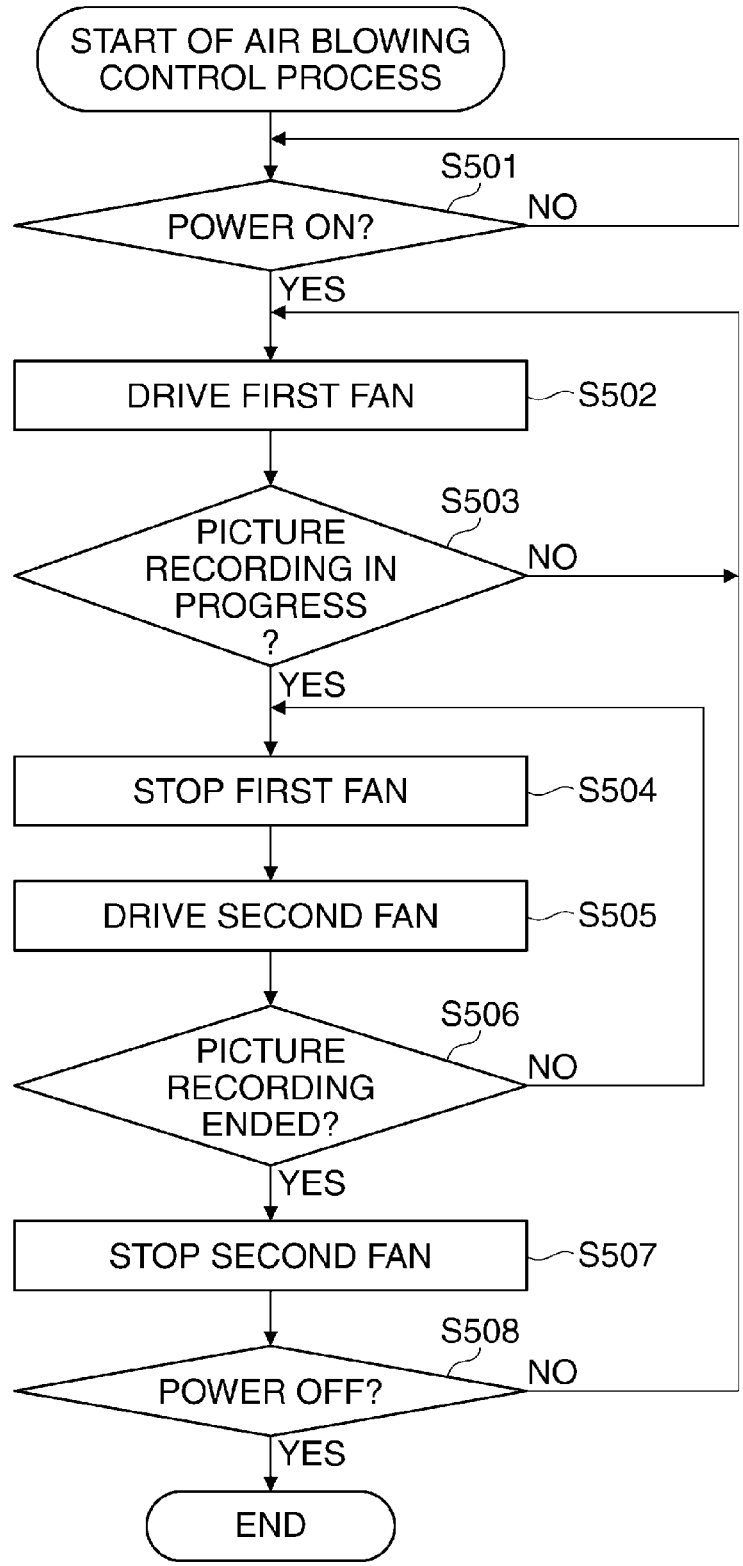
FIG. 5 is a flowchart useful in explaining an exemplary air blowing control process which is carried out by the camera in FIG. 1.

FIG. 5 is a flowchart useful in explaining an exemplary air blowing control process which is carried out by the camera 100 in FIG. 1. It should be noted that the process of the flowchart in FIG. 5 is carried out by the CPU 102 expanding a program stored in the ROM 103 onto the RAM 104 and executing the same.

When the air blowing control process is started, the CPU 102 judges whether or not the power has been turned on by the user operating the power button 200 (step S501). When the power has not been turned on (NO in the step S501), the CPU 102 stands by. On the other hand, when the power has been turned on (YES in the step S501), the CPU 102 drives the first fan 306 (step S502).

The CPU 102 then judges whether or not picture recording (image pickup) has been started by the user operating the shutter button 201, that is, picture is in progress (step S503). It should be noted that sound is recorded at the same time during picture recording. When picture recording is not in progress (NO in the step S503), the process returns to the step S502, in which the CPU 102 in turn continues to drive the first fan 306.

On the other hand, when picture recording is in progress (YES in the step S503), the CPU 102 stops the first fan 306 (step S504). The CPU 102 then drives the second fan 308 (step S505).

The CPU 102 then judges whether or not picture recording has been ended by the user operating the shutter button 201 (step S506). When picture recording has not been ended (NO in the step S506), the process returns to the step S504, in which the CPU 102 in turn keeps the first fan 306 at a standstill and continues to drive the second fan 308.

When picture recording has been ended (YES in the step S506), the CPU 102 stops the second fan 308 (step S507). The CPU 102 then judges whether or not the power has been turned off by the user operating the power button 200 (step S508).

When the power has not been turned off (NO in the step S508), the process returns to the step S502, in which the CPU 102 in turn drives the first fan 306. On the other hand, when the power has been turned off (YES in the step S508), the CPU 102 brings the air blowing control process to an end.

Although in the flowchart described with reference to FIG. 5, the first fan 306 and the second fan 308 are selectively driven according to whether or not picture recording is in progress, the CPU 102 may selectively drive the first fan 306 and the second fan 308 according to temperature data obtained by the first, second, and third temperature sensing units 204, 302, and 309.

During picture recording, the first fan 306 and the second fan 308 are selectively driven as described above with reference to FIG. 5, and to perform image pickup without recording sound, for example, the CPU 102 drives the first fan 306 when a temperature represented by temperature data obtained by the first temperature sensing unit 304 becomes equal to or higher than a predetermined temperature. Also, when a temperature represented by temperature data obtained by the second temperature sensing unit 302 becomes equal to or higher than a predetermined temperature, the CPU 102 drives the first fan 306. Likewise, when a temperature represented by temperature data obtained by the third temperature sensing unit 309 becomes equal to or higher than a predetermined temperature, the CPU 102 drives the second fan 308.

Thus, in the first embodiment of the present invention, when picture recording that involves sound recording is to be stopped, the camera 100 is cooled using the first fan 306 with high heat discharging capability, and when picture recording that involves sound recording is to be performed, the camera 100 is cooled using the low-noise second fan 308. As a result, the speed at which temperatures of electric elements mounted on a substrate or the like is kept low even during picture recording that involves sound recording, and also, the picture recording time period is allowed to be set at a long time period without affecting sound recording.

It should be noted that although in the first embodiment, only a substrate is used as an exemplary heat source connected thermally to the duct 305, this is not limitative, but a plurality of heat sources may be thermally connected to the duct 305.

Further, a plurality of fans may be disposed in a single duct 305, and the number of fans disposed in the duct 305 is not limited. Further, a plurality of fans may be placed so as to circulate air inside the camera, and the number of fans for circulation in the camera is not limited to the above example. Additionally, there may be a plurality of ducts for discharging heat, and the number of ducts is not limited to the above example.

Moreover, the number of temperature sensing units provided in the camera may be one, and further, temperature sensing units may be provided for respective heat sources. The number and layout of temperature sensing units are not limited to the above example.

A description will now be given of an exemplary camera according to a second embodiment of the present invention. It should be noted that an arrangement of the camera according to the second embodiment is the same as that of the camera in FIGS. 1 to 4.

Figure 6:
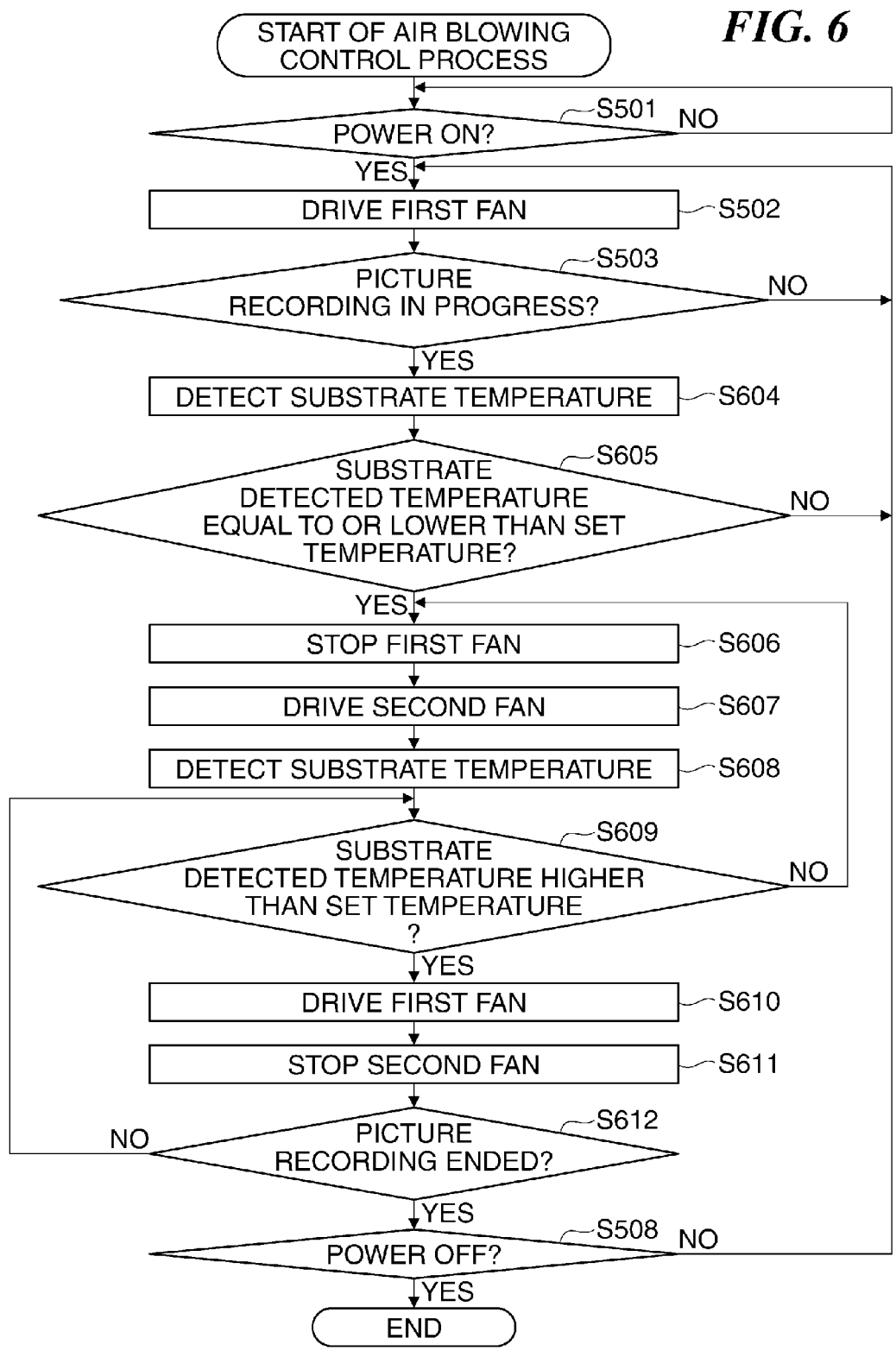
FIG. 6 is a flowchart useful in explaining an exemplary air blowing control process which is carried out by a camera according to a second embodiment of the present invention.

FIG. 6 is a flowchart useful in explaining an exemplary air blowing control process which is carried out by the camera 100 according to the second embodiment of the present invention.

It should be noted that the process of the flowchart in FIG. 6 is carried out by the CPU 102 expanding a program stored in the ROM 103 onto the RAM 104 and executing the same. In the flowchart of FIG. 6, the same steps as those in the flowchart of FIG. 5 are designated by the same reference symbols, and description thereof is omitted.

When, in the step S503, picture recording is in progress, the CPU 102 detects a temperature of the substrate 303 using the first temperature sensing unit 304 and writes the detected temperature, which has been obtained using the first temperature sensing unit 304, in the RAM 104 (step S604). The CPU 102 then compares temperature data (set temperature) set in advance in the ROM 103 with the temperature data on the substrate 303 (substrate detected temperature) written in the RAM 104 by the CPU 102 in the step S604 and judges whether or not the substrate detected temperature is equal to or lower than the set temperature (step S605).

When the substrate detected temperature is higher than the set temperature (NO in the step S605), the process returns to the step S502, in which the CPU 102 in turn continues to drive the first fan 306. On the other hand, when the substrate detected temperature is equal to or lower than the set temperature (YES in the step S605), the CPU 102 stops the first fan 306 (step S606). The CPU 102 then drives the second fan 308 (step S607).

The CPU 102 then detects a temperature of the substrate 303 using the first temperature sensing unit 304 (step S608) and writes temperature data, which has been obtained using the first temperature sensing unit 304, in the RAM 104 (step S608). The CPU 102 then compares the set temperature with the temperature data on the substrate 303 (substrate detected temperature) written in the RAM 104 by the CPU 102 in the step S608 and judges whether or not the detected substrate temperature has become higher than the set temperature (step S609).

When the substrate detected temperature is equal to or lower than the set temperature (NO in the step S609), the process returns to the step S606, in which the CPU 102 in turn continues to keep the first fan 306 at rest and continues to drive the second fan 308. On the other hand, when the substrate detected temperature has become higher the set temperature (YES in the step S609), the CPU 102 drives the first fan 306 (step S610). The CPU 102 then stops the second fan 308 (step S611).

After that, the CPU 102 judges whether or not picture recording has been ended by the user operating the shutter button 201 (step S612). When picture recording has not been ended (NO in the step S612), the process returns to the step S609, in which the CPU 102 in turn judges whether or not the substrate detected temperature is equal to or higher than the set temperature. On the other hand, when the CPU 102 judges that picture recording has been ended (YES in the step S612), the process returns to the step S508 described with reference to FIG. 5.

Thus, in the second embodiment of the present invention, when picture recording is stopped, the CPU 102 cools the camera 100 using the first fan 306 with high heat discharging capability, and when picture recording is in progress, the CPU 102 cools the camera 100 using the low-noise second fan 308. On this occasion, the CPU 102 cools the camera a100 using the first fan 306 with high heat discharging capability before a malfunction of electric elements such as a CPU mounted on the substrate 303 is caused to occur due to an increase in the temperature of the substrate 303. As a result, the speed at which temperatures of electric elements such as a CPU mounted on a substrate or the like is kept low even during picture recording while suppressing occurrence of a malfunction, and also, the picture recording time period is allowed to be set at a long time period without affecting sound recording.

A description will now be given of an exemplary camera according to a third embodiment of the present invention. It should be noted that an arrangement of the camera according to the third embodiment is the same as that of the camera in FIGS. 1 to 4.

Figure 7:
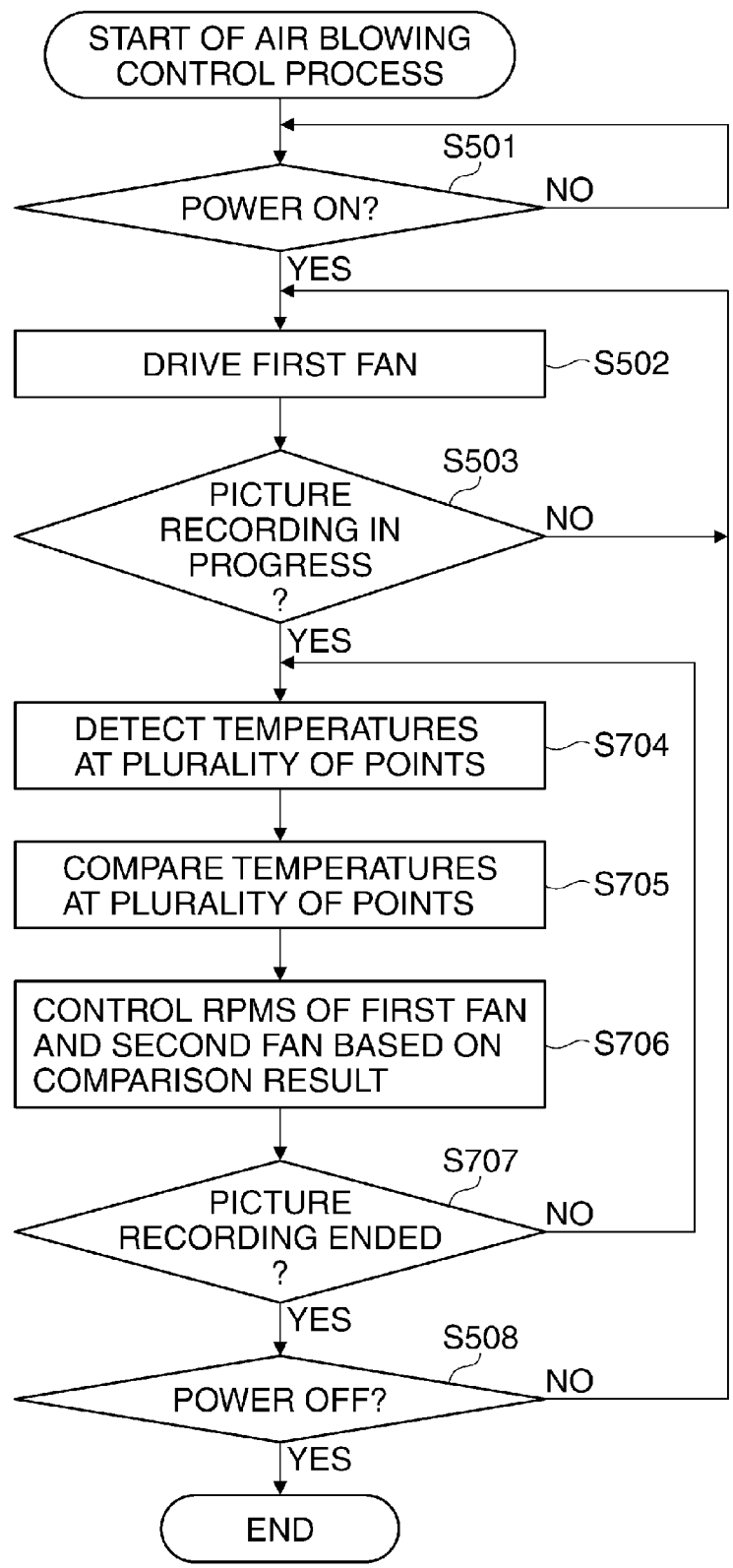
FIG. 7 is a flowchart useful in explaining an exemplary air blowing control process which is carried out by a camera according to a third embodiment of the present invention.

FIG. 7 is a flowchart useful in explaining an exemplary air blowing control process which is carried out by the camera 100 according to the third embodiment of the present invention.

It should be noted that the process of the flowchart in FIG. 7 is carried out by the CPU 102 expanding a program stored in the ROM 103 onto the RAM 104 and executing them. In the flowchart of FIG. 7, the same steps as those in the flowchart of FIG. 5 are designated by the same reference symbols, and description thereof is omitted.

When, in the step S503, picture recording is in progress, the CPU 102 detects temperatures at a plurality of points (step S704). Here, the CPU 102 detects temperatures of the substrate 303, the image pickup device 301, and the battery 111 using the first, second, and third temperature sensing units 304, 302, and 309, respectively. The CPU 102 then writes, in the RAM 104, the detected temperatures of the substrate 303, the image pickup device 301, and the battery 111 as first, second, and third temperature data, respectively.

The CPU 102 then compares a substrate set temperature, an image pickup device set temperature, and a battery set temperature recorded in advance in the ROM 103 with the first, second, and third temperature data, respectively, to obtain first, second, and third comparison results (step S705). Then, according to the first, second, and third comparison results, the CPU 102 controls RPMs, that is, air volumes of the first fan 306 and the second fan 308 (step S706).

FIG. 8 is a view showing a control table for use in the RPM control step S706 in FIG. 7.

The control table in FIG. 8 is set in advance in, for example, the ROM 103. It is assumed here that a substrate set temperature, an image pickup device set temperature, and a battery set temperature are Xp, Xc, and Xb, respectively, and first, second, and third temperature data are Tp, Tc, and Tb, respectively.

When the first, second, and third comparison results obtained in the step S705 are represented by Tp≤Xp, Tc≤Xc, and Tb≤Xb, respectively, the CPU 102 stops the first fan 306 and drives the second fan 308 at a high RPM set in advance. When the first, second, and third comparison results obtained in the step S705 are represented by Tp>Xp, Tc≤Xc, and Tb≤Xb, respectively, the CPU 102 lowers the RPM of the first fan 306 to a predetermined low RPM and drives the second fan 308 at a high RPM set in advance.

When the first, second, and third comparison results are represented by Tp>Xp, Tc>Xc, and Tb≤Xb, respectively, the CPU 102 raises the RPM of the first fan 306 to a predetermined high RPM and drives the second fan 308 at a low RPM set in advance. When the first, second, and third comparison results obtained in the step S705 are represented by Tp>Xp, Tc≤Xc, and Tb>Xb, respectively, the CPU 102 raises the RPM of the first fan 306 to a predetermined high RPM and drives the second fan 308 at a low RPM set in advance.

When the first, second, and third comparison results are represented by Tp>Xp, Tc>Xc, and Tb>Xb, respectively, the CPU 102 raises the RPM of the first fan 306 to a predetermined high RPM and does not drive (stops) the second fan 308. When the first, second, and third comparison results are represented by Tp'Xp, Tc>Xc, and Tb≤Xb, respectively, the CPU 102 lowers the RPM of the first fan 306 to a predetermined low RPM and drives the second fan 308 at a low RPM set in advance.

When the first, second, and third comparison results are represented by Tp≤Xp, Tc>Xc, and Tb>Xb, respectively, the CPU 102 lowers the RPM of the first fan 306 to a predetermined low RPM and does not drive (stops) the second fan 308. When the first, second, and third comparison results are represented by Tp≤Xp, Tc≤Xc, and Tb>Xb, respectively, the CPU 102 lowers the RPM of the first fan 306 to a predetermined low RPM and drives the second fan 308 at a low RPM set in advance.

In RPM control in the step S706, the CPU 102 drivingly controls the first fan 306 and the second fan 308 in any of eight control patterns shown in the control table according to the comparison result obtained in the step S705.

The CPU 102 then judges whether or not picture recording has been ended by the user operating the shutter button 201 (step S707). When picture recording has not been ended (NO in the step S707), the process returns to the step S704, in which the CPU 102 in turn detects temperatures at a plurality of points. On the other hand, when the CPU 102 judges that picture recording has been ended (YES in the step S707), the process proceeds to the step S508 described with reference to FIG. 5.

Thus, in the third embodiment of the present invention, when picture recording is to be stopped, the camera 100 is cooled using the first fan 306 with high heat discharging capability. Further, when picture recording is to be performed, a temperature of the substrate 303 thermally connected to the duct 305 and temperatures of the image pickup device 301 and the battery 111 which are thermally independent of the duct 305 are detected. According to the relationship between the detected temperature thus obtained and a temperature set in advance, the camera 100 is cooled by selectively driving the first fan 306 and the second fan 308 in low-noise combinations.

As a result, through the use of the second fan 308, heat of the duct 305 and the substrate 303 is diffused into the interior of the camera, and an increase in the temperature of air in the camera is prevented. This prevents an increase in the temperature of the substrate 303 caused by a decrease in the amount of heat exhausted from the image pickup device 301 and the battery 111 which are thermally independent of the duct 305, and therefore prevents malfunctioning of electric elements such as a CPU mounted on the substrate 303.

Thus, in the third embodiment, a picture recording time period is allowed to be set at a long time period without causing malfunctioning of electric elements while reducing effects on sound recording.

It should be noted that there has only to be at least one heat source thermally independent of a duct, and the number of heat sources thermally independent of a duct is not limited to the above example. Also, when the RPMs of fans are controlled, the fans have only to be at least stopped or rotated, and the RPMs of the fans are not limited to the above examples.

Although in the above description of the embodiments, image pickup apparatuses such as digital cameras are taken as examples, the embodiments described above may be similarly applied to electronic apparatuses insofar as they have a function of recording external sound (audio).

As is clear from the above description, in the example shown in FIGS. 1 to 4, the CPU 102 acts as a control unit, and the second temperature sensing unit 302 and the third temperature sensing unit 302 act as a second temperature detecting unit. The first temperature detection unit 304 acts as a first temperature sensing unit.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-045945, filed Mar. 9, 2015, which is hereby incorporated by reference herein in its entirety.

What is claimed is:

1. An electronic apparatus that has a heat source and a sound recording function, comprising:
    a duct unit which has an inlet and an outlet and thermally connected to heat source;
    a temperature sensor which senses a temperature of the heat source;
    a first air blowing unit which blows air in said duct unit from the inlet toward the outlet;
    a second air blowing unit which circulates air inside the electronic apparatus; and
    a controller which controls said first air blowing unit and said second air blowing unit according to a sound recording operation and the temperature sensed by said temperature sensor,
    wherein said controller controls said first air blowing unit to stop and said second air blowing unit to drive in a case where the sound recording operation is in progress and the temperature is equal to or lower than a predetermined temperature.

2. The electronic apparatus according to claim 1, wherein said controller controls said first air blowing unit in a case where power is turned on, and said controller stops said first air blowing unit and controls said second air blowing unit to drive in a case where the sound recording operation is started.

3. The electronic apparatus according to claim 1, wherein said controller controls said first air blowing unit and stops said second air blowing unit in a case where the temperature sensed by said temperature sensor becomes higher than the predetermined temperature after said controller stops said first air blowing unit and drives said second air blowing unit.

4. The electronic apparatus according to claim 1, wherein the electronic apparatus includes an image pickup apparatus that records an image of a subject.

5. An electronic apparatus that has a heat source and a sound recording function, comprising:
- a duct unit which has an inlet and an outlet and thermally connected to the heat source;
- a first temperature sensor which senses a temperature of the heat source;
- a second temperature sensor which senses a temperature of another heat source;
- a first air blowing unit which blows air in said duct unit from the inlet toward the outlet,
- a second air blowing unit which circulates air inside the electronic apparatus; and
- a controller which controls an amount of air blown by said first air blowing unit and said second air blowing unit according to a relationship between temperatures sensed by said first temperature sensing unit and said second temperature sensing unit and a predetermined temperature in a case where a sound recording operation is in progress.

6. The electronic apparatus according to claim 5, wherein said controller controls said first air blowing unit in a case where power is turned on, and said controller stops said first air blowing unit and controls said second air blowing unit to drive in a case where the sound recording operation is started.

7. The electronic apparatus according to claim 5, wherein the electronic apparatus includes an image pickup apparatus that records an image of a subject.

8. The electronic apparatus according to claim 5, wherein said another heat source includes a power source.

9. An electronic apparatus that has a recording function, comprising:
- a duct unit which joins an inlet and an outlet formed in a cabinet of the electronic apparatus and is thermally connected to a heat source;
- a temperature sensor which senses a temperature of the heat source;
- a first air blowing unit which blows air in said duct unit from the inlet toward the outlet;
- a second air blowing unit which circulates air inside the electronic apparatus; and
- a controller which controls an amount of air blown by said first air blowing unit and said second air blowing unit according to a sensing output of said temperature sensing unit in a case where a recording operation is in progress,
- wherein said controller controls said first air blowing unit to drive in a case where power is turned on, and said controller stops said first air blowing unit and controls said second air blowing unit to drive in a case where the recording operation is started.

10. The electronic apparatus according to claim 9, wherein the electronic apparatus includes an image pickup apparatus that records an image of a subject.

11. An electronic apparatus that has a recording function, comprising:
- a duct unit which joins an inlet and an outlet formed in a cabinet of the electronic apparatus and is thermally connected to a heat source;
- a temperature sensor which senses a temperature of the heat source;
- a first air blowing unit which blows air in said duct unit from the inlet toward the outlet;
- a second air blowing unit which circulates air inside the electronic apparatus; and
- a controller which controls an amount of air blown by said first air blowing unit and said second air blowing unit according to a sensing output of said temperature sensing unit in a case where a recording operation is in progress,
- wherein said controller controls said first air blowing unit to drive and stops said second air blowing unit in a case where the temperature sensed by said temperature sensor becomes higher than a predetermined temperature after said controller stops said First air blowing unit and controls said second air blowing unit to drive.

12. The electronic apparatus according to claim 11, wherein the electronic apparatus includes an image pickup apparatus that records an image of a subject.

13. An electronic apparatus that has sound recording function, comprising:
- a duct unit which joins an inlet and an outlet formed in a cabinet of the electronic apparatus and is thermally connected to a heat source;
- a first temperature sensor which senses a temperature of the heat source thermally connected to said duct unit;
- a second temperature sensor which senses a temperature of another heat source;
- a first air blowing unit which blows air in said duct unit from the inlet toward the outlet;
- a second air blowing unit which circulates air inside the electronic apparatus; and
- a controller which controls an amount of air blown by said first air blowing unit and said second air blowing unit according to sensing outputs of said first temperature sensing unit and said second temperature sensing unit in a case where a recording operation is in progress,
- wherein said controller controls said first air blowing unit to drive in a case where power is turned on, and said controller stops said first air blowing unit and controls said second air blowing unit to drive in a case where the recording operation is started.

14. The electronic apparatus according to claim 13, wherein said another heat source includes a power source.

15. The electronic apparatus according to claim 13, wherein the electronic apparatus includes an image pickup apparatus that records an image of a subject.

* * * * *